(12) United States Patent
Badcock et al.

(10) Patent No.: US 11,545,558 B2
(45) Date of Patent: Jan. 3, 2023

(54) METHOD OF MANUFACTURING A TRANSISTOR

(71) Applicant: PARAGRAF LIMITED, Somersham (GB)

(72) Inventors: Thomas James Badcock, Somersham (GB); Robert Wallis, Somersham (GB); Ivor Guiney, Somersham (GB); Simon Thomas, Somersham (GB)

(73) Assignee: Paragraf Limited, Somersham (GB)

( * ) Notice: Subject to any disclaimer, the term of this patent is extended or adjusted under 35 U.S.C. 154(b) by 0 days.

(21) Appl. No.: 17/473,852

(22) Filed: Sep. 13, 2021

(65) Prior Publication Data

US 2022/0102525 A1  Mar. 31, 2022

(30) Foreign Application Priority Data

Sep. 28, 2020 (GB) ...................................... 2015321
Nov. 3, 2020 (GB) ...................................... 2017408

(51) Int. Cl.
| | | |
|---|---|---|
| H01L 29/66 | (2006.01) | |
| H01L 21/04 | (2006.01) | |
| H01L 29/78 | (2006.01) | |
| H01L 29/16 | (2006.01) | |
| H01L 29/76 | (2006.01) | |

(52) U.S. Cl.
CPC ...... *H01L 29/66045* (2013.01); *H01L 21/042* (2013.01); *H01L 29/1606* (2013.01); *H01L 29/7606* (2013.01); *H01L 29/7839* (2013.01)

(58) Field of Classification Search
CPC combination set(s) only.
See application file for complete search history.

(56) References Cited

U.S. PATENT DOCUMENTS

| | | |
|---|---|---|
| 10,593,546 B2 | 3/2020 | Thomas |
| 2018/0012962 A1 | 1/2018 | Yeh et al. |
| 2019/0035907 A1 | 1/2019 | Boutchich et al. |
| 2020/0350443 A1* | 11/2020 | Lee ..................... H01L 31/1136 |

FOREIGN PATENT DOCUMENTS

| | | |
|---|---|---|
| CN | 102157548 A | 8/2011 |
| CN | 106952949 A | 7/2017 |

* cited by examiner

*Primary Examiner* — Moin M Rahman
(74) *Attorney, Agent, or Firm* — Stinson LLP

(57) ABSTRACT

There is provided a method of manufacturing a transistor, the method comprising: (a) providing a substrate having a semiconductor surface; (b) providing a graphene layer structure on a first portion of the semiconductor surface, wherein the graphene layer structure has a thickness of n graphene monolayers, wherein n is at least 2; (c) etching a first portion of the graphene layer structure to reduce the thickness of the graphene layer structure in said first portion to from n−1 to 1 graphene monolayers; (d) forming a layer of dielectric material on the first portion of the graphene layer structure; and (e) providing: a source contact on a second portion of the graphene layer structure; a gate contact on the layer of dielectric material; and a drain contact on a second portion of the semiconductor surface of the substrate.

20 Claims, 2 Drawing Sheets

METHOD OF MANUFACTURING A TRANSISTOR

REFERENCE TO RELATED APPLICATIONS

The present application claims the benefit of United Kingdom Application Nos. 2015321.9, filed Sep. 28, 2020, and 2017408.2 filed Nov. 3, 2020, the entire contents of which are incorporated herein by reference.

FIELD OF THE INVENTION

The present invention relates to a method of manufacturing a transistor. In particular, the present invention provides a novel and improved approach for the manufacture of a graphene-semiconductor transistor that is more efficient and reliable for use in electronic circuits. The present invention also provides a transistor, in particular a transistor comprising a graphene layer structure on a portion of a semiconductor surface of a substrate.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, Volume 6, 183-191, March 2007 and in the focus issue of Nature Nanotechnology, Volume 9, Issue 10, October 2014.

Graphene is being investigated for a range of potential applications. Most notable is the use of graphene in electronic devices and their constituent components and include transistors, LEDs, photovoltaic cells, Hall-effect sensors, diodes and the like.

However, there remains a need for a method of manufacturing graphene-based transistors that are capable of delivering the potential that graphene offers, at least is terms of its theoretical electronic properties. There remains a need for a method of manufacturing transistors comprising graphene that allow for the production of improved field-effect transistors that have improved electronic properties, both in improved electrical conductivity (with reduced losses such as to heat) as well as improved gate function in the operation of the transistor to provide improved $I_{on}/I_{off}$ ratios.

US 2018/0012962 A1 discloses FET devices having a black phosphorus layered material which is a semiconductor with a direct band gap ranging from about 1.5 eV for a monolayer to 0.59 eV for a five-layer stack (where such a band gap is not present in graphene) for improved switching, and seeks to address problems with contact resistance.

EP 3206232 A1 relates to a FET comprising fluorinated graphene and seeks to overcome problems with known dielectric layers such as $SiO_2$, $Al_2O_3$ and graphene oxide.

CN 106952949 A relates to a graphene field effect transistor.

SUMMARY OF THE INVENTION

It is an object of the present invention to provide an improved method for manufacturing a graphene-semiconductor transistor and a graphene-semiconductor transistor per se which overcome, or substantially reduce, problems associated with the prior art. At the very least, the present invention provides a commercially useful non-obvious alternative.

Accordingly, in a first aspect there is provided a method of manufacturing a transistor, the method comprising:
(a) providing a substrate having a semiconductor surface;
(b) providing a graphene layer structure on a first portion of the semiconductor surface, wherein the graphene layer structure has a thickness of n graphene monolayers, wherein n is at least 2;
(c) etching a first portion of the graphene layer structure to reduce the thickness of the graphene layer structure in said first portion to from n−1 to 1 graphene monolayers;
(d) forming a layer of dielectric material on the first portion of the graphene layer structure; and
(e) providing:
  a source contact on a second portion of the graphene layer structure;
  a gate contact on the layer of dielectric material; and
  a drain contact on a second portion of the semiconductor surface of the substrate.

DETAILED DESCRIPTION

Figure 1:
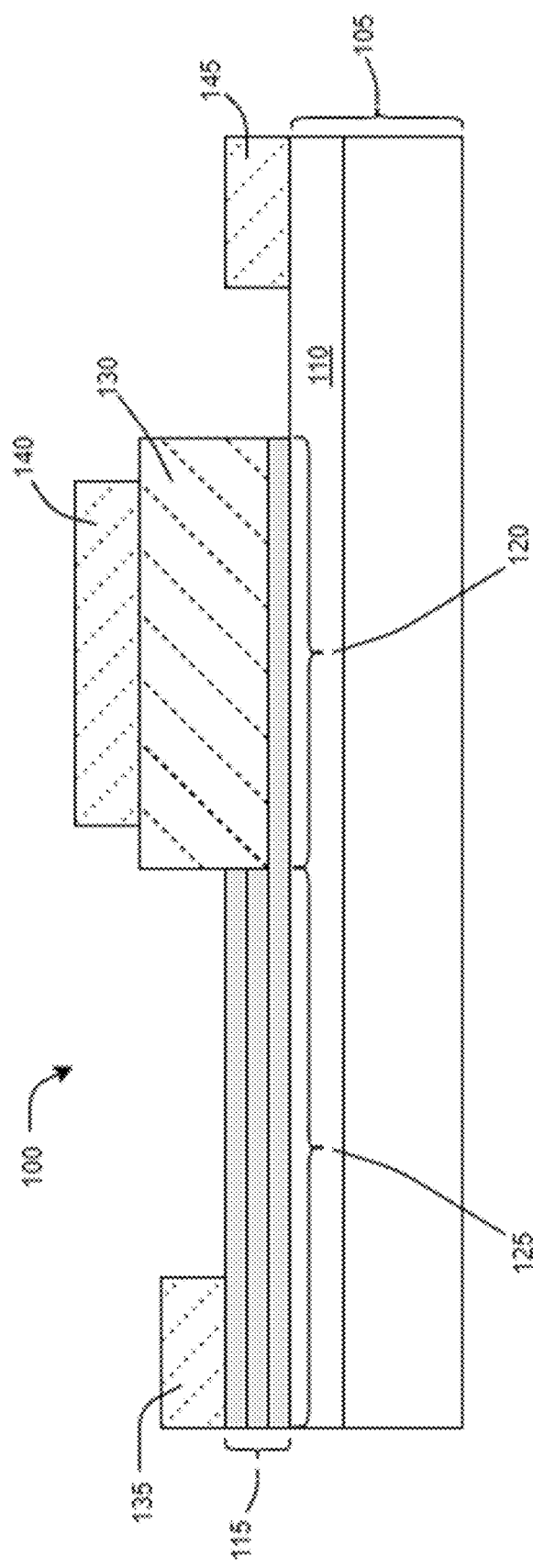
FIG. 1 shows a cross-section of a graphene-semiconductor transistor as described herein.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The method described herein provides a method for manufacturing a graphene-semiconductor transistor. A graphene-semiconductor transistor is a transistor which comprises graphene having an interface with a semiconductor. Preferably, the method provides a graphene field-effect transistor which is a type of transistor which uses an electric field to modulate the flow of current. In the case of a graphene transistor, there is a flow of current through the graphene, with the graphene forming a channel region.

Field-effect transistors are known in the art and comprise a gate electrode (or contact) to which a voltage may be applied which in turn modulates the conductivity between the source and drain electrodes (contacts). Graphene on a semiconductor is particularly preferable for use in transistors since graphene is a zero band gap semiconductor (i.e. a semimetal) whose Fermi energy can be modified by a voltage applied to a gate contact. The work function of the graphene sheet can advantageously be adjusted over a wide range by tuning of the Fermi energy via the gate. The transistor as described herein therefore also demonstrates a temperature stable $I_{on}/I_{off}$ ratio (where 6 is current to turn on and $I_{off}$ is current to turn off).

A graphene-semiconductor (Schottky-type) junction is one of the simplest conceivable components in an electronic device in hybrid graphene-semiconductor technology. Accordingly, graphene-semiconductor junctions have been the study of much research and are increasingly more common in electronic devices such as transistors. However, despite the considerable effort made in the art to understand the behaviour of the junction in order to improve its functional characteristics, none of the prior art provides any indication of a transistor comprising a multilayer graphene layer structure that is reduced in thickness (and preferably reduced to a monolayer) under the gate contact/electrode. The inventors have found the combination of two portions of different thickness of graphene in a transistor provides an advantage over known graphene transistors. The thinner first portion of the graphene layer structure provides for more efficient modulation of the density of states whilst the thicker second portion provides an advantageous improvement in both current and heat conduction.

As described herein, the method of the present invention comprises providing a graphene layer structure on a substrate. Specifically, the method comprises providing a graphene layer structure on a portion of the substrate, the substrate having a semiconductor surface in order to provide for a graphene-semiconductor transistor.

Accordingly, the method comprises the step of providing a substrate having a semiconductor surface. Preferably, the entire surface of the substrate is a semiconductor (the surface being formed of semiconductor material) and even more preferably, the substrate consists of semiconductor material. Preferably, the semiconducting surface of the substrate, and even more preferably the entire substrate, comprises elemental silicon, elemental germanium, silicon carbide and/or III-V semiconductors such as binary GaN and AlN and also ternary, quaternary and higher order III-V semiconductors such as InGaN, InGaAs, AlGaN, InGaAsP.

Preferably, at least the surface consists of one or more of such semiconducting materials. It is particularly preferred that the substrate is silicon or a III-V semiconductor compound.

Preferably, the substrate has a substantially flat surface upon which the graphene layer structure is provided. The substrate may be any known in the art that is at least partially formed of a semiconductor material, such that the surface on which the transistor is to be formed is made of a semiconductor material. That is, the substrate could have a laminate structure with multiple layers, provided that the upper surface on which the graphene layer structure is to be formed is composed of semiconductor material.

A substantially flat substrate surface is one having substantially no steps or discontinuities. The substrate may be considered to be one having a difference in thickness (between maximum and minimum thickness, which includes this difference in thickness at the junction of the insulator/semiconductor surface of the substrate) of less than 50 nm, such as less than 10 nm and preferably less than 5 nm and preferably less than 1 nm. A substantially flat substrate surface may be considered to be one having a mean surface roughness (Ra) of less than 100 nm, such as less than 50 nm and preferably less than 10 nm.

It is preferred that the semiconductor surface of the substrate (and the whole of the substrate if applicable) is doped. When doped, the semiconductor surface may be either p- or n-type doped. Preferably, the doped semiconductor surface has a dopant concentration of greater than $10^{15}$ cm$^{-3}$, more preferably greater than $10^{16}$ cm$^{-3}$ and/or less than $10^{20}$ cm$^{-3}$, preferably less than $10^{19}$ cm$^{-3}$. A most preferred range is from $10^{16}$ cm$^{-3}$ to $10^{18}$ cm$^{-3}$. Preferably a semiconductor (such as a semiconductor surface or a semiconductor material) has a conductivity as measured at room temperature of greater than $10^{-5}$ S/cm preferably at least $10^{-4}$ S/cm.

The term graphene layer structure as used herein means one or more layers of graphene stacked to form a coating of graphene on the substrate. The graphene layer structure provided on the first portion of the semiconductor surface has a thickness of n graphene layers (monolayers). The graphene layer structure provided in this step of the method consists of at least two graphene monolayers, i.e. n is at least 2. n is preferably at least 3 and more preferably at least 4. n may also, or alternatively, be less than 50, preferably less than 25, even more preferably less than 15.

As described herein, the method results in a graphene layer structure having at least two portions, each portion having different thicknesses. As will be appreciated, the etched first portion of the graphene layer structure therefore has a thickness that is less than the un-etched remaining second portion of the graphene layer structure.

Accordingly, in a preferred embodiment, the graphene layer structure consists of the first and second portions of different thicknesses. Accordingly, when carrying out the method, the graphene layer structure having a thickness of n graphene layers is reduced in thickness in a first portion to from n−1 to 1 graphene layers and the second portion remains with a thickness of n.

The step of providing a graphene layer structure on a substrate may be achieved by any method known in the art. Deposition of a graphene layer structure by VPE or MOCVD is particularly preferable, particularly where the substrate provides a non-metallic surface upon which the graphene layer structure is directly formed. It is particularly preferable that a graphene layer structure is provided on a substrate by MOCVD as described in WO 2017/029470 and as such, providing graphene directly on a substrate by MOCVD is one of a number of graphene manufacturing processes known in the art, the scope of which will be understood by the skilled person. The process of manufacturing graphene by MOCVD is described further herein. This approach is particularly preferred because there is no need for a transfer step with the graphene, such as when growing on a copper catalyst surface, since these steps introduce undesirable contaminants which severely affect device performance.

Accordingly, in one particularly preferred embodiment, the graphene layer structure is provided on a substrate by MOCVD or CVD, and/or wherein the step of providing the graphene layer structure comprises:

providing the substrate on a heated susceptor in a reaction chamber, the chamber having a plurality of cooled inlets arranged so that, in use, the inlets are distributed across the substrate and have constant separation from the substrate;

supplying a flow comprising a carbon-containing precursor compound through the inlets and into the reaction chamber to thereby decompose the precursor compound and form the graphene layer structure on the substrate, wherein the inlets are cooled to less than 100° C. and the susceptor is heated to a temperature of at least 50° C. in excess of a decomposition temperature of the precursor.

Preferably, the graphene provided on a substrate is maintained under a substantially inert atmosphere after its synthesis until the layer of dielectric material is formed thereon, and even more preferably until the entirety of the graphene layer structure has been encapsulated (such as with a barrier coating of inorganic oxide or polymer which may be formed after provision of the contacts). Preferably, the inert atmosphere consists of hydrogen, helium, argon, nitrogen or mixtures thereof, preferably argon or nitrogen.

The inventors have found that graphene, in particular the surface of graphene, is sensitive to a range of gases present in ambient air. The properties of graphene (such as electrical and optical properties) can be dramatically altered by the adsorption of atmospheric gases, in particular oxygen and water. The extent to which the adsorption of atmospheric gases have an effect on the properties of graphene layer structure may depend on factors such as the magnitude of doping. When exposed to air, graphene undergoes a reaction that results in higher carrier concentrations and reduced mobility.

Accordingly, the method as described herein preferably further comprises not exposing the graphene layer structure to an oxygen-containing atmosphere before the step of etching and/or forming a layer of dielectric material. The step of not exposing the graphene layer structure to an oxygen-containing atmosphere preferably comprises maintaining the graphene layer structure under an inert atmosphere. However, the step of not exposing the graphene layer structure to an oxygen-containing atmosphere may comprise minimising the exposure, such as less than 1 minute, less than 20 seconds or less than 10 seconds. This may be preferable so as to enable a simpler manufacturing process without having to ensure such a strict exclusion of contact with the atmosphere without substantially affecting the graphene properties due to the minimal exposure.

It is particularly preferred that, where the method comprises not exposing the graphene layer structure to an oxygen-containing atmosphere, the method comprises providing a graphene layer structure on the substrate by VPE or MOCVD as described herein. Such a method allows for the direct formation of a graphene layer structure on a portion of a surface of a semiconductor surface of a substrate within a reaction chamber without the need for further processing to provide graphene on such desirable substrate (i.e. one for use in a graphene-semiconductor transistor as described herein). In contrast, graphene transfer processes, for example, may require etching of the metal substrate upon which graphene has been formed. Typical substrates include copper. The etching and transfer processes can have a detrimental effect on the quality of the graphene layer structure, the copper and etching solutions results in chemical modification of the surface of the graphene layer structure and such processes also take place in the presence of water and/or air. A VPE or MOCVD reactor may itself be provided in an inert atmosphere (such as a glovebox) so as to enable the relevant steps of the method to be carried out under an atmosphere that is substantially free of air and moisture (in other words, one that has less than about 1000 ppm $O_2$ and less than about 1000 ppm $H_2O$, preferably less than about 500 ppm of each of $O_2$ and $H_2O$, even more preferably less than about 100 ppm).

Advantageously, this allows for a robust and stable transistor comprising graphene. Such a device therefore has a long service life and maintains excellent function throughout its life due to the reduced contamination of the graphene layer structure that would otherwise affect the carrier concentrations and carrier mobilities amongst other electronic properties once put into use.

The graphene layer structure provided on a portion of a semiconductor surface of a substrate may also be a doped graphene layer structure. In this embodiment, the graphene is preferably doped with one or more elements selected from the group consisting of silicon, magnesium, zinc, arsenic, oxygen, boron, bromine and nitrogen.

Accordingly, where the graphene layer structure is provided by MOCVD, the method may further comprise introducing a doping element into the reaction chamber and selecting a temperature of the substrate, a pressure of the reaction chamber and a gas flow rate to produce graphene doped with the doping element. Alternatively, a second precursor comprising the doping element can be introduced to the reaction chamber.

A graphene layer structure is provided in the method described herein on a portion of the semiconductor surface of the substrate. The graphene layer structure may then be subjected to a treatment, such as laser ablation, or standard photolithographic methods, suitable to remove a portion of the graphene layer structure. A portion of the semiconductor surface is required for subsequent provision of a drain contact as described herein in order to provide a point for connection of the transistor into a circuit.

The inventors have found that it is particularly advantageous to employ graphene layer structures comprising more than one layer of graphene (multiple layer graphene) in electronic devices such as transistors to provide an improvement in the electrical conductivity of the final graphene-containing device. Thicker graphene layer structures can also be preferable due to their improved thermal conductivity relative to thinner counterparts. Multilayer graphene is also easier to handle and control the properties of.

However, some of the advantageous electronic properties associated with monolayer graphene (or at least thinner graphene than preferred) are therefore lost. The inventors have found that monolayer graphene (or fewer layer graphene) is particularly advantageous in field effect transistors wherein the application of a gate voltage across a single graphene layer/sheet allows the Fermi level of the graphene to be modified in turn modulating how the density of states in the graphene are filled. This modulation is more pronounced in thinner graphene layer structures and this therefore provides a marked improvement in the operation of the transistor (i.e. the control of the flow of current between source and drain) compared to thicker graphene.

The present invention provides a method of manufacturing a transistor comprising graphene which comprises at least two portions of different thicknesses so as to benefit from both of the advantages afforded by having both thicker and thinner portions of a graphene layer structure in a single transistor.

The method further comprises etching a first portion of the graphene layer structure that is provided on a portion of the semiconductor surface of the substrate. The step of etching reduces the thickness of the graphene layer structure in the first portion from n graphene monolayers to from n−1 to 1 graphene monolayers. For the avoidance of doubt, the first portion is not the whole of the surface of the graphene layer structure, since at least a second portion is not etched on which the source contact is formed.

Preferably, the method comprises etching the first portion of the graphene layer structure to reduce the thickness in said first portion to from n−1 to 1 graphene monolayers such that the thickness is reduced to 3 or fewer graphene monolayers, preferably 2 or fewer graphene monolayers, more preferably 1 graphene monolayer. Thus, in an embodiment wherein the first portion is reduced to 3 graphene monolayers, n is at least 4 such that the step of etching the first portion results in a decrease in the thickness. For example, in such an embodiment when n is 4, the graphene is etched in a first portion to a thickness of n−1 (i.e. 3). Naturally, there are alternative embodiments wherein the thicker second portion defined by n may be, for example, 3 and the graphene layer structure etched in a first portion to, for example, n−2 (i.e. 1 graphene monolayer). Thus, the ranges described above for the thickness of the first portion of the graphene layer structure will be understood to lie in the general range of n−1 to 1 such that the method necessarily comprises etching a thicker graphene layer structure defined by a thickness of n graphene monolayers. In a particularly preferred embodiment, n is 4 and the first portion is etched to a thickness of 1 graphene monolayer.

The step of etching a first portion of the graphene layer structure preferably comprises plasma etching and/or laser etching and/or atomic layer etching so as to reduce the thickness of the graphene layer structure in said first portion to from n−1 to 1 graphene monolayers. More preferably, the etching is atomic layer etching. In alternatively preferred embodiments described herein, etching may be performed simultaneously with the formation of the layer of dielectric material. The etching of only a portion of the graphene layer structure may be achieved with selective masking or by using an accurate etching technique.

Atomic layer etching (ALE) is particularly preferred as a method for the reduction in thickness of a graphene layer structure. ALE (similar to atomic layer deposition) can be a self-limiting chemical modification which affects only the top layer of the material. ALE can be divided into two categories, plasma ALE and thermal ALE. A typical example in the art is plasma etching of silicon by an alternating reaction between chlorine and argon ions to remove individual atomic layers in a stepwise manner. The process is self-limiting if the etching gas which absorbs onto the surface of the material stops absorbing after one monolayer. ALE further comprises purging unreacted etching gas and bombardment with low energy inert ions to physically desorb the reacted surface layer. This process may also be self-limiting if the low energy inert ions have insufficient energy to etch the underlying and unreacted layers. The reaction chamber is once again purged before the cycle is repeated (if desired). In thermal ALE, the modified surface may be heated to volatilise top layer.

In one exemplary embodiment, a first portion of the graphene layer structure is etched by ALE which comprises the steps of a chemical absorption step using a oxygen-ion beam (($O_2^+/O^+$)-ion beam) and a physical desorption step using an argon ($Ar^+$)-ion beam. The oxygen-ion beam may be generated with 100 sccm of $O_2$, 15 W of rf power, and with axial magnetic field of 30 Gauss for 90 s. The argon-ion beam may be generated with 100 sccm of Ar and 500 W of rf power for 120 s. Each repetition of these steps results in the reduction in thickness of the graphene layer structure in the first portion by one graphene monolayer. Accordingly, tri-layer graphene may be etched in a first portion to provide monolayer graphene in said first portion by two ALE cycles.

The method further comprises forming a layer of dielectric material on the first portion of the graphene layer structure. Preferably, the layer of dielectric material will be formed/deposited on the entirety of the first portion of the graphene layer structure. The material is capable of forming a barrier so as to avoid the unwanted oxidation, doping, and/or contamination of the reduced thickness graphene layer thereby preserving the precise electronic properties of the graphene layer structure having a thickness of from n−1 to 1 graphene monolayers. Preferably, the layer of dielectric material is further formed/deposited on an adjacent semiconductor surface of the substrate such that the edge(s) of the first portion of the graphene layer structure are also covered. This is particularly preferred to prevent conduction between the graphene layer structure and the contacts deposited on the second portion of the semiconductor surface.

The dielectric material may comprise any material known in the art to be dielectric. Accordingly, the dielectric material is electrically insulating and typically has a high dielectric constant unlike a classic insulator. The dielectric constant (k) of the dielectric material may be greater than 2, preferably greater than 3 and even more preferably greater than 4 (when measured at 1 kHz at room temperature). In some applications for the transistor, such as high frequency applications, it may preferable for the dielectric constant of the dielectric material to be lower than that which may be used in other applications, such as low frequency applications. Accordingly, k may be less than 10, preferably less than 6. Dielectric materials may therefore polarise in an electric field.

Preferably, the dielectric material comprises LiF, silicon nitride, a dielectric metal oxide, and/or an organic dielectric polymer. Exemplary dielectric materials for use in the method described herein include one or more of PMMA, PVA, PVB, LiF, $Al_2O_3$, ZnO, $TiO_2$, $ZrO_2$, $SrO_2$, $HfO_2$, SiN, $SiO_2$, AlN, AlGaAs, AlGaN, and AlP.

Preferably, the layer of dielectric material has a thickness of less than 300 nm, such as less than 200 nm, less than 150 nm, preferably less than 100 nm and/or greater than 1 nm, such as greater than 5 nm, preferably greater than 10 nm. Accordingly, the dielectric layer may have a thickness of between 1 nm and 300 nm, preferably between 1 nm and 100 nm.

The dielectric layer may be formed by any appropriate technique known in the art to the skilled person. Deposition of an inorganic dielectric, such as a metal oxide, may be achieved by molecular beam deposition (MBD), atomic layer deposition (ALD), chemical vapour deposition (CVD), and/or physical vapour deposition (PVD). Alternatively, deposition of a dielectric may be achieved using standard photolithography techniques. Photolithography techniques are particularly suitable for the deposition of an organic dielectric material, such as one comprising PMMA. As with the deposition techniques above, a mask may be used to selectively deposit and/or pattern the dielectric material on the first portion of the graphene layer structure. For example, the PMMA resist may be applied to the entirety of the substrate (or at least all of the deposited graphene layer structure including any or all of the second portion) and a mask applied so as to expose the undesired portions of PMMA to radiation. The exposed PMMA resist may be developed and subsequently removed.

Accordingly, in a preferred embodiment, the layer of dielectric material is provided by atomic layer deposition, physical vapour deposition, such as electron beam deposition or thermal evaporation, chemical vapour deposition, plasma enhanced chemical vapour deposition or metal organic chemical vapour deposition.

The steps of etching a first portion of the graphene layer structure and formation of a layer of dielectric material on the first portion may take place in a single step. That is, the method may preferably comprise forming a layer of dielectric material on a first portion of the graphene layer structure so as to simultaneously reduce the thickness of the first portion of the graphene layer structure to from n−1 to 1 graphene monolayers and form the dielectric layer thereon. By way of example, this may be achieved by the plasma-enhanced atomic layer deposition of the layer of dielectric material such as the atomic layer deposition of a dielectric oxide as described herein ($Al_2O_3$, ZnO, $TiO_2$, $ZrO_2$, $SrO_2$, $HfO_2$ and $SiO_2$, preferably $Al_2O_3$, $HfO_2$, $TiO_2$ or $SiO_2$).

Preferred methods involve physical vapour deposition methods such as sputtering, preferably magnetron sputtering. Other preferred methods include plasma enhanced atomic layer deposition.

Sputtering is known in the art as a high energy technique which has been known to generate extensive damage to graphene when depositing further materials thereon. Likewise, plasma is relatively more aggressive than other known techniques which can damage the underlying graphene.

In one embodiment, a remote oxygen plasma with low ion bombardment in PE-ALD may be used to avoid fast etching of graphene whilst the reaction between precursor and graphene leads to physical/chemical modification and subsequent dielectric deposition. Preferably, in such embodiments, a single graphene layer is etched by the deposition process. Accordingly, it is preferred that the graphene layer structure is either bi-layer or tri-layer graphene (i.e. n is 2 or 3) and the graphene is etched in a first portion to a monolayer or bi-layer, respectively (i.e. to 1 or 2 layers). Without wishing to be bound by theory, the inventors have found that the carbon forming the upper layer of a multilayer graphene layer structure is ablated during the process or absorbed into the dielectric layer (essentially as a dopant).

This process is particularly advantageous as the graphene layers which remain in the etched portion having the dielectric material deposited thereon are less likely to be damaged (in view of the upper layer acting as a sacrificial layer). This combined process also been found to promote adhesion between the dielectric layer and the remaining graphene layers.

In another similar embodiment, simultaneous etching and formation of a layer of dielectric material may be achieved by oxidation of a portion of the graphene layer structure so as to form a graphene oxide surface.

As described herein, etching reduces the thickness of the graphene layer structure in the first portion from n graphene monolayers to from n−1 to 1 graphene monolayers. Oxidation of a portion of a graphene layer structure results in the formation of a graphene oxide layer from the uppermost graphene monolayer of the graphene layer structure. Accordingly, in this embodiment, as with PE-ALD, the graphene layer structure is reduced in thickness by one graphene monolayer and preferably, this is from n being 2 graphene layers to 1 graphene layer in the first portion. The graphene oxide layer which forms is the dielectric material upon which the gate contact may subsequently be formed.

Oxidation of the graphene layer structure may be achieved using an oxidising solution known in the art to oxidise graphene to graphene oxide. Typically, this involves contact of the first portion of graphene layer structure with an oxidising solution comprising sulfuric acid, potassium permanganate and sodium nitrate, such as Hummers' solution as is known in the art. The degree of oxidation of the graphene/graphene oxide may vary depending on the conditions used, temperatures and duration of oxidation. Typically, graphene oxide has a mole ratio of carbon to oxygen of from 2:1 to 5:1 such as from 2:1 to 3:1 which creates a band gap in the graphene. Regardless of the actual ratio of carbon to oxygen, the graphene oxide layer forms the layer of dielectric material and is therefore at least electrically insulative as described herein.

The method further comprises the step of providing a source contact on a second portion of the graphene layer structure, a gate contact on the layer of dielectric material, and a drain contact on the semiconductor surface of the substrate.

The three contacts may be provided by any technique known in the art to the skilled person. The step of providing said contacts may comprise using a mask to selectively deposit the contact(s) on the specific portions of graphene, dielectric layer and substrate surface. In particular, the source contact being provided on a second portion of the graphene provides a contact on the thicker un-etched portion of the etched graphene layer structure.

As will be appreciated by the skilled person, the method comprises the steps described herein and may be performed in any relevant order. For example, the contacts may be provided in separate steps as is known in the art. The step of providing any contact may be before or after any other steps in the method described herein. For example, the source and drain may be provided after the step of forming graphene yet before the step of forming a layer of dielectric material on a portion of the graphene.

Preferably, the drain contact provided on the semiconducting surface of the substrate is provided such that the contact does not abut (or adjoin, or border) the first portion of the graphene layer structure disposed on the semiconductor substrate. Nevertheless, the drain contact will typically be provided next to this portion of the graphene so as to be arranged distal to the source contact. Such an arrangement of drain and source contacts relative to the gate contact which lies therebetween is conventional in the art so as to modulate current flow between the source and drain and is known to the skilled person so as to provide a transistor.

Providing the drain contact on an adjacent semi-conducting portion of the substrate is specific for a graphene transistor so as to provide a Schottky barrier which enables an improvement in the modulation of current flow. Specifically, by providing a gate contact above the thinner portion of graphene, modulation of the Fermi level provides an improvement in the modulation of the Schottky barrier height and control of the transistor on/off ratio despite the lack of band gap in graphene.

Preferably, there is a gap between the graphene layer structure disposed on the first portion of the semiconductor surface and the drain contact disposed on the second portion of the semiconductor surface of the substrate of at least 1 nm, preferably at least 5 nm and most preferably at least 10 nm. It is particularly preferred that the layer of dielectric material as described herein is disposed in the gap and on the exposed portion of substrate between the graphene layer structure and drain contact. Preferably the gate contact is provided between the drain and source contacts relative to the surface of the substrate.

The gate contact is provided on the layer of dielectric material which is itself on the first portion of the graphene layer structure. As described herein, the layer of dielectric material is preferably formed on the entirety of the first portion of the graphene layer structure and may also be formed on adjacent regions in order to ensure complete coverage (i.e. the dielectric may be formed on the adjacent exposed semiconductor surface of the substrate and/or the adjacent second portion of the graphene layer structure). It will therefore be appreciated that the thinner first portion extends so as to comprise an edge of the graphene layer structure where the dielectric layer therefore covers the edge of the graphene and prevents unwanted conduction between the first portion and the drain contact. The gate is then preferably provided above the entirety of the first portion of the graphene layer structure.

The contacts preferably comprise one or more of titanium, chromium and gold, preferably chromium and/or gold. The contacts are preferably deposited by electron beam deposition, preferably using a mask. Whilst the size and composition of the three contacts (source, gate and drain) may be the same or different, the terminology used will be understood by the person skilled in the art as specific contacts for use in incorporation into an electrical device. In other words, once electrical connections are provided on the contacts, the skilled person would understand how these are subsequently circuited to enable operation of the transistor.

In a preferred embodiment, the method further comprises connecting the transistor into an electronic circuit via the three contacts.

In a further aspect, there is provided a transistor, the transistor comprising:
- a graphene layer structure on a first portion of a semiconductor surface of a substrate, wherein a first portion of the graphene layer structure has a first thickness, and wherein a second portion of the graphene layer structure has a second thickness, wherein the second thickness is n graphene monolayers and n is at least 2, and wherein the first thickness is from n−1 to 1 graphene monolayers;
- a layer of dielectric material on the first portion of the graphene layer structure; and
- a source contact on the second portion of the graphene layer structure;
- a gate contact on the layer of dielectric material; and
- a drain contact on a second portion of the semiconductor surface of the substrate.

The graphene transistor as described herein may be obtainable by, and preferably is obtained by, the method described herein.

In a preferred embodiment, n is at least 3, preferably at least 4. Preferably, the first portion of the graphene layer structure has a thickness of 3 or fewer graphene monolayers, 2 or fewer graphene monolayers and more preferably 1 graphene monolayer.

Accordingly, regardless of whether the thicker second portion of the graphene layer structure is, for example, 2 layers thick, 4 layers thick or even 15 or more layers thick, the first portion of the graphene layer structure need be thinner and preferably has a thickness of 3 or fewer graphene monolayers wherein it will be appreciated that a thinner first portion consisting of 3 monolayers may only be achieved wherein n is at least 4.

Thus, in preferred embodiments of the present invention, the first thickness is less than 4 monolayers and the second thickness n is at least 4, preferably less than 50, less than 25 and more preferably less than 15. In specific preferred embodiments, the first thickness is 3 graphene monolayers and the second thickness is 4 graphene monolayers, or the first thickness is 2 graphene monolayers and the second thickness is 4 graphene monolayers or most preferably the first thickness is 1 graphene monolayer and the second thickness is 4 graphene monolayers.

In other preferred embodiments of the present invention, the first thickness is less than 3 monolayers and the second thickness n is at least 3, preferably less than 50, less than 25 and more preferably less than 15. In specific preferred embodiments, the first thickness is 2 graphene monolayers and the second thickness is 3 graphene monolayers, or the first thickness is 1 graphene monolayer and the second thickness is 3 graphene monolayers.

In some preferred embodiments, the first thickness is 1 graphene monolayer and the second thickness is 2 graphene monolayers.

Thus, the transistor of the present invention advantageously has low contact resistance due to the presence of a thicker graphene portion whilst also being more sensitive to gate voltages due to the thinner portion of graphene and therefore having improved control over the current flow.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors. Methods disclosed in WO 2017/029470 are preferably used to provide a graphene layer structure on a substrate in the method disclosed herein. The method of WO 2017/029470 provides two-dimensional materials, particularly graphene, with a number of advantageous characteristics including: very good crystal quality; large material grain size; minimal material defects; large sheet size; and self-supporting.

MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials but would simply require the use of a carbon containing precursor. Instead, the use of this term indicates to the person skilled in the art a general set of process and apparatus features. MOCVD is further distinct from CVD techniques by virtue of the system complexity and accuracy. While CVD techniques allow reactions to be performed with straightforward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. MOCVD is particularly preferred for achieving high quality graphene layer structures that are highly uniform and continuous across a large area without the deformations, dislocations and other problems associated with graphene produced by other methods.

The total thickness of the substrate is typically 50 to 1500 µm, preferably 400 µm to 1200 µm. However, thicker substrates also work and thick silicon wafers, for example, are up to 2 mm thick. The minimum thickness of the substrate is however determined in part by the substrate's mechanical properties and the maximum temperature at which the substrate is to be heated. The maximum area of the substrate is dictated by the size of the, preferably close coupled, reaction chamber. Preferably, the substrate has a diameter of at least 15 cm (6 inches), preferably 15 to 61 cm (6 to 24 inches) and more preferably 15 to 30 cm (6 to 12 inches). The substrate can be cut after growth to form individual devices using any known method.

The chamber has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®. Other suitable growth chambers include Turbodisc K-series or Propel MOCVD systems available from Veeco Instruments Inc.

Figure 2:
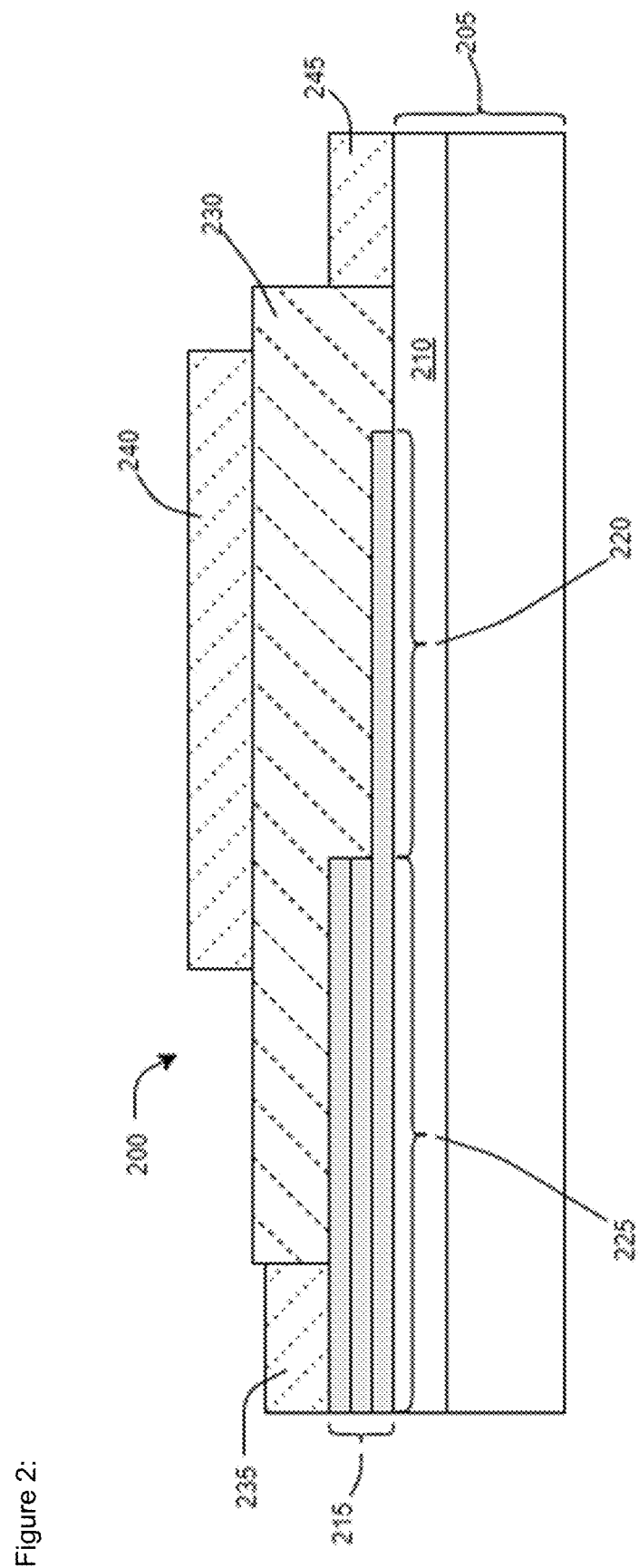
FIG. 2 shows a cross-section of an alternative graphene-semiconductor transistor as described herein.

The present invention will now be described further with reference to the following non-limiting Figures, in which FIG. 1 shows a cross-section of a graphene-semiconductor transistor as described herein. FIG. 2 shows a cross-section of an alternative graphene-semiconductor transistor as described herein.

FIG. 1 shows a cross-section of an exemplary graphene-semiconductor transistor 100 comprising a silicon substrate 105 having a silicon semiconductor surface 110. The graphene transistor 100 further comprises a graphene layer structure 115 provided on a first portion of the semiconductor surface of the substrate 105.

A first portion 120 of the graphene layer structure 115 has a thickness of 1 graphene monolayer. A second portion 125 of the graphene layer structure 115 has a thickness of n graphene monolayers, wherein n is 3 and therefore the first portion 120 of the graphene layer structure 115 results from the etching of two graphene monolayers to leave a single graphene monolayer. In the example illustrated in FIG. 1, the graphene layer structure 115 is composed of only two portions; a first thinner portion and a second thicker portion.

The graphene-semiconductor transistor further comprises a layer of dielectric material, $Al_2O_3$, 130 on the first portion 120 of the graphene layer structure 115. As shown in FIG. 1, the $Al_2O_3$ 130 is formed across the entirety of the first portion 120 of the graphene layer structure 115 which is a graphene monolayer. Finally, the transistor 100 comprises three electrical contacts: a source contact 135 on the second thicker portion 125 of the graphene layer structure 115, a drain contact 145 on a further portion of the semiconductor surface of the substrate 105 (i.e. a second portion of the semiconductor surface), and a gate contact 140 on the $Al_2O_3$ 130 thereby being directly above the thinner portion 120 of the graphene layer structure 115.

FIG. 2 illustrates a cross-section of an alternative embodiment of a transistor 200. The transistor 200 is similar to transistor 100 except that the $Al_2O_3$ 230 is also deposited across part of the thicker portion 225 of the graphene layer structure 215 and on further portion of the silicon surface 210 of the silicon substrate 205. In accordance with the invention, the $Al_2O_3$ 230 is on the first thinner portion 220 of the graphene layer structure 215 and a gate contact 240 is formed on the $Al_2O_3$ 230. In this embodiment, the gate 240 is situated above the entirety of the first thinner portion 220. This is particularly preferable due to the improved interaction of the thin portion 220 of graphene with the voltage applied to the gate contact 240 during use. Furthermore, the layer of dielectric 230 being on the semiconductor surface 210 between the graphene layer structure 215 and drain 245 prevents unwanted conduction between the graphene and the drain 245 by ensuring a physical separation.

EXAMPLES

A silicon wafer with a polished, epiready finish was placed into an MOCVD reactor. The wafer was heated up to 1070° C. and a flow of 60 slm of ultrapure hydrogen gas was exposed to the surface of the wafer for 10 minutes to remove the native oxide layer from the silicon wafer. Next, the gas was switched to 50 slm of ultrapure nitrogen, and a flow of hexane of 90 sccm was exposed to the silicon wafer for 1 hour and 2 minutes. This resulted in four monolayers of graphene forming on the wafer surface.

Next, the wafer was cooled down to room temperature, and PMMA was spun onto the wafer. A mask was placed over the surface, and the PMMA was selectively exposed to UV light. The mask was removed and the PMMA and graphene was removed by oxygen plasma etching in the selected areas. A separate oxygen plasma treatment was applied to the remaining PMMA to just remove this layer. In this way, areas of four monolayer thick graphene remained on the silicon wafer.

Next, the entire wafer was coated with PMMA again, and an opening in the middle of the graphene/silicon device was exposed. This exposed the four monolayers of graphene. Next, the structure was placed into an atomic layer etching system, and exposed to three cycles of 100 sccm of $O_2$, 15 W of rf power, and with axial magnetic field of 30 Gauss for 270 seconds followed by 100 sccm of Ar and 500 W of rf power for 120 seconds. This resulted in three monolayers of graphene being etched away, leaving just one monolayer in the exposed areas.

Next, the structure was placed into an atomic layer deposition system. The wafer was heated to 100° C., and three pre-pulses of $O_2$ plasma were introduced to the monolayer of graphene, followed by the deposition of 2 nm of $Al_2O_3$ by alternate pulses of $O_2$ plasma and trimethylaluminium. The system was heated to 150° C., and a further 3 nm was deposited with the same precursors before the wafer was cooled to room temperature. Next, ohmic contacts were deposited onto the graphene and silicon, to form a graphene-silicon Schottky diode structure, and a contact was deposited on the $Al_2O_3$, to serve as a gate electrode.

As used herein, the singular form of "a", "an" and "the" include plural references unless the context clearly dictates otherwise. The use of the term "comprising" is intended to be interpreted as including such features but not excluding other features and is also intended to include the option of the features necessarily being limited to those described. In other words, the term also includes the limitations of "consisting essentially of" (intended to mean that specific further components can be present provided they do not materially affect the essential characteristic of the described feature) and "consisting of" (intended to mean that no other feature may be included such that if the components were expressed as percentages by their proportions, these would add up to 100%, whilst accounting for any unavoidable impurities), unless the context clearly dictates otherwise.

It will be understood that, although the terms "first", "second", etc. may be used herein to describe various elements, layers and/or portions, the elements, layers and/or portions should not be limited by these terms. These terms are only used to distinguish one element, layer or portion from another, or a further, element, layer or portion. It will be understood that the term "on" is intended to mean "directly on" such that there are no intervening layers between one material being said to be "on" another material. Spatially relative terms, such as "below", "beneath", "lower", "above", "upper" and the like, may be used herein for ease of description to describe one element or feature's relationship to another element(s) or feature(s). It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented and the spatially relative descriptors used herein interpreted accordingly.

The foregoing detailed description has been provided by way of explanation and illustration, and is not intended to limit the scope of the appended claims. Many variations of the presently preferred embodiments illustrated herein will be apparent to one of ordinary skill in the art, and remain within the scope of the appended claims and their equivalents.

The invention claimed is:

1. A method of manufacturing a transistor, the method comprising:
   (a) providing a substrate having a semiconductor surface;
   (b) providing a graphene layer structure on a first portion of the semiconductor surface, wherein the graphene layer structure has a thickness of n graphene monolayers, wherein n is at least 2 and wherein providing the graphene layer structure comprises providing the substrate on a heated susceptor in a reaction chamber, the chamber having a plurality of cooled inlets arranged so that, in use, the inlets are distributed across the substrate and have constant separation from the substrate, and supplying a flow comprising a carbon-containing precursor compound through the inlets and into the reaction chamber to thereby decompose the precursor compound and form the graphene layer structure on the substrate, wherein the inlets are cooled to less than 100° C. and the susceptor is heated to a temperature of at least 50° C. in excess of a decomposition temperature of the precursor;
   (c) etching a first portion of the graphene layer structure to reduce the thickness of the graphene layer structure in said first portion to from n−1 to 1 graphene monolayers;
   (d) forming a layer of dielectric material on the first portion of the graphene layer structure; and
   (e) providing: a source contact on a second portion of the graphene layer structure; a gate contact on the layer of dielectric material; and a drain contact on a second portion of the semiconductor surface of the substrate.

2. The method according to claim 1, wherein the graphene layer structure consists of the first and second portions.

3. The method according to claim 1, wherein the layer of dielectric material is further formed on an adjacent semiconductor surface of the substrate thereby covering the edge of the first portion of the graphene layer structure.

4. The method according to claim 1, wherein n is at least 3.

5. The method according to claim 4, wherein n is at least 3, and wherein in step (c) the first portion of the graphene layer structure is etched to reduce the thickness of the graphene layer structure in said first portion to 2 or fewer graphene monolayers.

6. The method according to claim 4, wherein n is at least 4, and wherein in step (c) the first portion of the graphene layer structure is etched to reduce the thickness of the graphene layer structure in said first portion to 3 or fewer graphene monolayers.

7. The method according to claim 1, wherein in step (c) the first portion of the graphene layer structure is etched to reduce the thickness of the graphene layer structure in said first portion to 1 graphene monolayer.

8. The method according to claim 1, wherein the etching comprises plasma etching and/or laser etching and/or atomic layer etching.

9. The method according to claim 1, wherein the layer of dielectric material is provided by atomic layer deposition, physical vapour deposition, chemical vapour deposition, plasma enhanced chemical vapour deposition or metal organic chemical vapour deposition.

10. The method according to claim 1, wherein the thickness of the layer of dielectric material is from 1 nm to 300 nm.

11. The method according to claim 1, wherein the graphene layer structure is a doped graphene layer structure.

12. The method according to claim 1, wherein the substrate comprises elemental silicon and/or a III-V semiconductor compound.

13. The method according to claim 1, wherein the method further comprises connecting the transistor into an electronic circuit via the three contacts.

14. The method according to claim 1, wherein steps (c) and (d) are achieved simultaneously by PE-ALD or oxidation of the first portion of the graphene layer structure so as to reduce the thickness of the graphene layer structure in said first portion to n−1 graphene monolayers and form a dielectric layer thereon.

15. The method according to claim 1, wherein the graphene layer structure is a doped graphene layer structure doped with one or more elements selected from the group consisting of silicon, magnesium, zinc, arsenic, oxygen, boron, bromine and nitrogen.

16. The method according to claim 1, wherein n is less than 50.

17. The method according to claim 1, wherein n is at least 4 and less than 15.

18. The method according to claim 1, wherein the etching comprises atomic layer etching.

19. The method according to claim 1, wherein the thickness of the layer of dielectric material is from 1 nm to 100 nm.

20. The method according to claim 1, wherein the substrate is silicon or a III-V semiconductor compound.

* * * * *